(12) United States Patent
Yi et al.

(10) Patent No.: US 10,429,685 B2
(45) Date of Patent: Oct. 1, 2019

(54) EMBEDDED TOUCH PANEL HAVING HIGH RESISTANCE FILM AND DISPLAY DEVICE

(71) Applicant: WGTECH (JIANGXI) CO., LTD., Xinyu (CN)

(72) Inventors: Weihua Yi, Xinyu (CN); Xun Zhang, Xinyu (CN); Huirong Zhou, Xinyu (CN); Bolun Zhang, Xinyu (CN); Rong Yu, Xinyu (CN)

(73) Assignee: WGTECH (JIANGXI) CO., LTD., Xinyu (CN)

( * ) Notice: Subject to any disclaimer, the term of this patent is extended or adjusted under 35 U.S.C. 154(b) by 0 days.

(21) Appl. No.: 15/735,604

(22) PCT Filed: Oct. 25, 2016

(86) PCT No.: PCT/CN2016/103180
§ 371 (c)(1),
(2) Date: Dec. 11, 2017

(87) PCT Pub. No.: WO2017/092516
PCT Pub. Date: Jun. 8, 2017

(65) Prior Publication Data
US 2018/0314095 A1 Nov. 1, 2018

(30) Foreign Application Priority Data
Dec. 4, 2015 (CN) .......................... 2015 1 0887484

(51) Int. Cl.
*G02F 1/1333* (2006.01)
*G06F 3/041* (2006.01)
(Continued)

(52) U.S. Cl.
CPC ........ *G02F 1/13338* (2013.01); *G02F 1/1333* (2013.01); *G02F 1/1368* (2013.01);
(Continued)

(58) Field of Classification Search
CPC ........... G02F 1/13338; G02F 1/136204; G02F 2202/22; G06F 3/0412; G06F 3/041;
(Continued)

(56) References Cited

U.S. PATENT DOCUMENTS

| 8,460,953 B2 | 6/2013 | Tanaka et al. |
| 2008/0014373 A1* | 1/2008 | Muramatsu ............... C08L 1/12 428/1.1 |

(Continued)

FOREIGN PATENT DOCUMENTS

| CN | 102193229 A | 9/2011 |
| CN | 102200872 A | 9/2011 |

(Continued)

OTHER PUBLICATIONS

International Search Report dated Jan. 26, 2017 for corresponding PCT International Application.

(Continued)

*Primary Examiner* — Angela K Davison
(74) *Attorney, Agent, or Firm* — Platinum Intellectual Property LLP

(57) ABSTRACT

An embedded touch panel (100) having a high resistance film (70) comprises a sequentially stacked first substrate (10), thin-film transistor substrate (20), liquid crystal layer (30), color filter (40), touch sensing layer (50), second substrate (60), and the high resistance film (70). A plurality of mutually insulated sensing wires are disposed on a surface of the thin-film transistor substrate (20) facing toward the liquid crystal layer (30). The thin-film transistor substrate (20) and the touch sensing layer (50) work together to embed a functionality of a touch panel into liquid crystal pixels, reducing a thickness of the touch panel (100). The high resistance film (70) is disposed on a surface of the second substrate (60) facing away from the touch sensing (Continued)

layer (50), and is electrically connected to the thin-film transistor substrate (20).

8 Claims, 2 Drawing Sheets

(51) Int. Cl.
*G02F 1/1362* (2006.01)
*G02F 1/1368* (2006.01)
*H01L 51/44* (2006.01)

(52) U.S. Cl.
CPC ........ *G02F 1/136204* (2013.01); *G06F 3/041* (2013.01); *G06F 3/0412* (2013.01); *G02F 2202/22* (2013.01); *G06F 2203/04103* (2013.01); *G06F 2203/04107* (2013.01); *H01L 51/445* (2013.01)

(58) Field of Classification Search
CPC . G06F 2203/04103; G06F 2203/04107; H01L 51/445
See application file for complete search history.

(56) References Cited

U.S. PATENT DOCUMENTS

| | | | | |
|---|---|---|---|---|
| 2011/0115739 A1* | 5/2011 | Song | ................... | G02F 1/13338 345/174 |
| 2011/0285640 A1* | 11/2011 | Park | ................... | G02F 1/13338 345/173 |
| 2013/0299214 A1* | 11/2013 | Frey | ..................... | H05K 9/0096 174/253 |
| 2013/0329171 A1 | 12/2013 | Ku et al. | | |
| 2016/0187692 A1* | 6/2016 | Woo | ..................... | G06F 3/0412 257/72 |

FOREIGN PATENT DOCUMENTS

| | | |
|---|---|---|
| CN | 103043654 A | 4/2013 |
| CN | 103236324 A | 8/2013 |
| CN | 103904312 A | 7/2014 |
| CN | 104073161 A | 10/2014 |
| CN | 104965617 A | 10/2015 |
| CN | 105425443 A | 3/2016 |
| CN | 105426006 A | 3/2016 |
| EP | 2325690 A2 | 5/2011 |
| JP | 2014102499 A | 6/2014 |
| TW | 201404245 A | 1/2014 |

OTHER PUBLICATIONS

Office Action by SIPO dated Jul. 6, 2018 for the corresponding Chinese patent application.
Extended European Search Report dated Oct. 19, 2018 for the corresponding European patent application.
Japanese Office Action dated Oct. 29, 2018 by JPO for the corresponding Japanese patent application.

\* cited by examiner

US 10,429,685 B2

EMBEDDED TOUCH PANEL HAVING HIGH RESISTANCE FILM AND DISPLAY DEVICE

RELATED APPLICATIONS

This application is a United States National Stage Application filed under 35 U.S.C 371 of PCT Patent Application Serial No. PCT/CN2016/103180, filed 25 Oct. 2016, which claims Chinese Patent Application Serial No. CN 201510887484.0, filed 4 Dec. 2015, the disclosure of all of which are hereby incorporated by reference in their entirety.

FIELD OF THE INVENTION

The present disclosure relates to the field of display devices, and more particularly relates to an in-cell touch screen having a high resistivity film and a display device.

BACKGROUND OF THE INVENTION

The touch screen is an important part of electronic devices such as mobile phones, tablet computers, e-books, and so on. At present, the touch screen in accordance with the composition and structure can generally be divided into: On-Cell and In-Cell. On-Cell refers to a method that the touch panel is embedded between the color filter substrate of the display screen and the polarizer. In other words, a touch sensor is provided on a liquid panel. Due to an addition of a touch layer, the thickness is thicker, such that it is easy to produce problems such as color inequality during touching. In-cell refers to a method that the touch panel function is embedded into liquid crystal pixels. In other words, the touch sensor function is embedded into the display screen, such that the overall thickness of the module is reduced, the manufacturing cost of the touch screen can also be greatly reduced, and is favored by the major panel manufacturers.

However, the in-cell touch screen generally requires that the touch sensor is embedded into pixels on the thin film transistor array substrate, and the touch sensors are easily interfered with each other, thereby causing a lower touch sensitivity.

SUMMARY OF THE INVENTION

Accordingly, it is necessary to provide an in-cell touch screen having a higher touch sensitivity and a display device.

An in-cell touch screen having a high resistivity film includes a first substrate, a thin film transistor substrate, a liquid crystal layer, a color filter, a touch sensing layer, a second substrate, and a high resistivity film, which are sequentially laminated. The thin film transistor substrate is provided with a plurality of mutually insulated sensing wires on a surface thereof facing the liquid crystal layer. The high resistivity film is formed on a surface of the second substrate away from the touch sensing layer, and the high resistivity film is electrically coupled to the thin film transistor substrate.

In one embodiment, the high resistivity film is made of a mixture comprising graphite oxide, tin oxide, a surfactant, and a crosslinking agent.

In one embodiment, the material of the high resistivity film includes, by weight parts, 4 to 7 parts of graphite oxide, 10 to 13 parts of tin oxide, 25 to 30 parts of surfactant, and 10 to 26 parts of crosslinking agent.

In one embodiment, the crosslinking agent is an aziridine crosslinking agent.

In one embodiment, the high resistivity film has a thickness of 30 nm to 50 nm.

In one embodiment, the in-cell touch screen having the high resistivity film further includes a polarizing layer laminated on a surface of the high resistivity film away from the second substrate.

In one embodiment, the in-cell touch screen having the high resistivity film further includes a protective cover plate laminated on a surface of the polarizing layer away from the high resistivity film.

In one embodiment, the in-cell touch screen having the high resistivity film has a thickness of 0.6 mm to 0.8 mm.

In one embodiment, the sensing wire is made of indium tin oxide (ITO).

A display device includes any one of the aforementioned in-cell touch screen having the high resistivity film.

The aforementioned in-cell touch screen having the high resistivity film includes the first substrate, the thin film transistor substrate, the liquid crystal layer, the color filter, the touch sensing layer, the second substrate, and the high resistivity film, which are sequentially laminated. The thin film transistor substrate is provided with the plurality of mutually insulated sensing wires on the surface thereof facing the liquid crystal layer. The thin film transistor substrate is engaged with the touch sensing layer, such that the touch panel function is embedded in the liquid crystal pixels, thereby reducing a thickness of the touch screen. The high resistivity film is disposed on the surface of the second substrate away from the touch sensing layer, and the high resistivity film is electrically coupled to the thin film transistor substrate. Thus, the electrostatic generated by the thin film transistor substrate can be discharged instantaneously by the high resistivity film, which plays a role of static elimination and reduces a mutual interference between the touch sensors, thereby improving the touch sensitivity of the in-cell touch screen.

DETAILED DESCRIPTION OF THE EMBODIMENTS

An in-cell touch screen having a high resistivity film and a method of manufacturing the same are described in further detail hereinafter with reference to the specific embodiments and the accompanying drawings.

Figure 1:
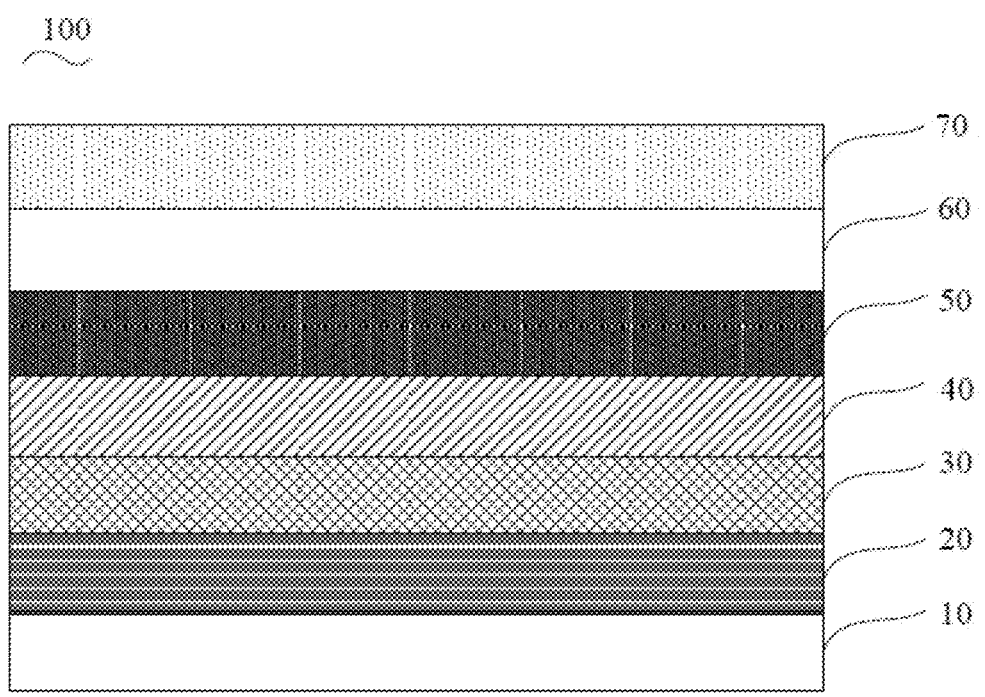
FIG. 1 is a schematic view of an in-cell touch screen having a high resistivity film according to an embodiment.

Referring to FIG. 1, an in-cell touch screen 100 having a high resistivity film according to an embodiment includes a first substrate 10, a thin film transistor substrate (TFT substrate) 20, a liquid crystal layer 30, a color filter 40, a touch sensing layer 50, a second substrate 60, and a high resistivity layer 70, which are sequentially laminated.

The thin film transistor substrate 20 is provided with a plurality of mutually insulated sensing wires on a surface thereof facing the liquid crystal layer 30. The high resistivity film 70 is formed on a surface of the second substrate 60 away from the touch sensing layer 50. The high resistivity film 70 is electrically coupled to the thin film transistor substrate 20. Specifically, the high resistivity film 70 can be electrically coupled to the thin film transistor substrate 20 via a lead.

The thin film transistor substrate 20 is provided with the plurality of mutually insulated sensing wires on the surface thereof facing the liquid crystal layer 30, and the plurality of mutually insulated sensing wires can be embedded into the liquid crystal layer 30. The thin film transistor substrate 20 is engaged with the touch sensing layer 50, such that the touch panel function is embedded in the liquid crystal pixels. The touch sensor function is embedded inside the display screen, thereby forming an In-Cell type touch screen, such that a thickness of the touch screen is reduced, making the screen more thinner and lighter. The high resistivity film 70 is disposed on the surface of the second substrate 60 away from the touch sensing layer 50, and the high resistivity film 70 is electrically coupled to the thin film transistor substrate 20. Thus, the electrostatic generated by the thin film transistor substrate 20 can be discharged instantaneously by the high resistivity film 70, which plays a role of static elimination and reduces a mutual interference between the touch sensors, thereby improving the touch sensitivity of the in-cell touch screen 100 having the high resistivity film.

In the illustrated embodiment, the in-cell touch screen 100 having the high resistivity film has a thickness of 0.6 mm to 0.8 mm. The thickness of the touch screen 100 is significantly reduced by embedding the touch panel function into the liquid crystal pixels.

Specifically, the first substrate 10 and the second substrate 60 can be made of light transmitting materials such as glasses.

Specifically, a sensing wire layer can be firstly formed on the surface of the thin film transistor substrate 20, and the sensing wires are formed on the surface of the thin film transistor substrate 20 after operations of exposure, development, etching, and the like.

Preferably, the sensing wire is made of indium tin oxide (ITO). Of course, the material of the sensing wire is not limited to ITO, but may be other conductive materials such as aluminum-doped zinc oxide (AZO). ITO has excellent electrical conductivity and light transmittance.

The liquid crystal layer 30 can be made of organic matters such as aliphatic, aromatic, stearic acid. The liquid crystal layer 30 can be formed between the thin film transistor substrate 20 and the color filter 40 by a liquid crystal perfusion method. In other words, after the thin film transistor substrate 20 and the color filter substrate 40 are aligned and assembled, the liquid crystal is sucked to form the liquid crystal layer by the capillary principle. Alternatively, using a dropping liquid crystal injection method, the liquid crystal is directly dropped onto the color filter substrate 40, and then the thin film transistor substrate 20 and the color filter 40 are aligned and assembled.

The touch sensing layer 50 is formed on the surface of the second substrate 60. The touch sensing layer 50 can be made of ITO. Of course, the material of the touch sensing layer 50 is not limited to ITO, but may be other conductive materials such as AZO. ITO has excellent electrical conductivity and light transmittance.

Specifically, the touch sensing layer 50 and the color filter 40 are bonded under vacuum conditions, thereby obtaining the first substrate 10, the thin film transistor substrate (TFT substrate) 20, the liquid crystal layer 30, the color filter 40, the touch sensing layer 50, and the second substrate 60, which are sequentially laminated.

The thin film transistor substrate 20 is engaged with the touch sensing layer 50, such that the touch panel function is embedded in the liquid crystal pixels, and the touch sensor function is embedded inside the display screen. The touch function is achieved under the driven of integrated circuit (IC).

Specifically, a material of the high resistivity film 70 is made of a mixture including graphite oxide, tin oxide, a surfactant, and a crosslinking agent.

Specifically, the mixture of graphite oxide, tin oxide, surfactant, and crosslinking agent can be printed or sprayed onto the surface of the second substrate 60 away from the touch sensing layer by methods such as screen printing or automatic spraying.

In the illustrated embodiment, a slurry is sprayed onto the surface of the second substrate 60 using an automatic spraying equipment. Preferably, a spraying gun has a distance of 20 cm to 40 cm from the surface of the second substrate 60, a spraying pressure is 0.5 MPa to 1.5 MPa, a temperature is 20° C. to 30° C., and a humidity is 50% to 60%.

Specifically, the slurry includes a mixture of graphite oxide, tin oxide, a surfactant, a crosslinking agent, and a solvent.

Preferably, the slurry includes, by weight parts, 4 to 7 parts of graphite oxide, 10 to 13 parts of tin oxide, 25 to 30 parts of surfactant, 10 to 26 parts of crosslinking agent, and 35 to 45 parts of solvent.

The solvent can be water or an organic solvent. Preferably, the slurry has a viscosity of 30 cP to 40 cP.

Graphite oxide (GO) is a new carbon material with excellent adsorption properties. Tin oxide ($SnO_2$) is an active oxide with semiconductor properties. Graphite oxide, tin oxide, the surfactant, and the crosslinking agent can be mixed to obtain a composite material with excellent performance. Tin oxide can change the surface properties of graphite oxide. The high porosity and large surface area of graphite oxide can also improve the dispersity of tin oxide. The synergistic effect of the various components causes the high resistivity film 70 to exhibit excellent adsorption and electrical properties.

The electrostatic generated by the thin film transistor substrate 20 can be discharged instantaneously by the high resistivity film 70 composed of the mixture of graphite oxide, tin oxide, the surfactant, and the crosslinking agent, thereby playing a role of static elimination and improving the touch sensitivity. Meanwhile, the high resistivity film 70 can be formed on the surface of the second substrate 60 without using an adhesive and the like due to its excellent adsorption performance, such that a thickness of the in-cell touch screen 100 having the high resistivity film hardly increases.

Preferably, the mixture of graphite oxide, tin oxide, the surfactant, and the crosslinking agent includes, by weight parts, 4 to 7 parts of graphite oxide, 10 to 13 parts of tin oxide, 25 to 30 parts of surfactant, and 10 to 26 parts of crosslinking agent.

In the illustrated embodiment, the mixture of graphite oxide, tin oxide, the surfactant, and the crosslinking agent includes, by weight parts, 5.5 parts of graphite oxide, 11.5 parts of tin oxide, 27.5 parts of surfactant, and 18 parts of crosslinking agent.

Specifically, the surfactant can be stearic acid, sodium dodecyl benzene sulfonate, quaternary ammonium compounds, lecithin, fatty acid glycerides, sorbitan fatty acid (Span), polysorbate (Tween) and the like.

In the illustrated embodiment, the surfactant is a DOW FAX 2A1 type surfactant produced by Dow Corporation of the United States.

Specifically, the crosslinking agent can be polyethylene, polyvinyl chloride, polyacrylate, polyalkyl acrylate, styrene, acrylonitrile, acrylic acid, methacrylic acid, glyoxal, aziridine and the like.

In the illustrated embodiment, the crosslinking agent is an aziridine crosslinking agent. Specifically, the crosslinking agent is SaC-100 type aziridine crosslinking agent produced by Shanghai Youen Chemical Co., Ltd.

The conventional touch screens generally require a substrate as a carrier, so as to reduce the interference of touch. However, the thickness of the product will be increased due to the addition of the carrier. The thickness after laminated will increase by about 0.4 mm, thereby greatly increasing the thickness of the electronic equipment (such as mobile phones). In addition, the light transmittance is poor, and the reflectivity under the sun is higher, which will directly influence the experience effect. Meanwhile, it is prone to problems during the bonding, thereby reducing the yield. This will lead directly to an increased cost and a long processing cycle, which is not suited to the incentive competitive environment of market.

The sensitivity of the touch screen can also be improved if the semiconductor material is used. However, semiconductor materials are expensive and have complex preparation process, which is not suitable for mass productions.

The mixture of graphite oxide, tin oxide, aziridine and anionic surfactant in accordance with the present disclosure has a strong adhesive force, an excellent electrical conductivity, a good light transmittance, and a strong stability, as well as is not easily oxidized. The manufacturing process is simple and suitable for mass productions.

Preferably, the high resistivity film 70 has a thickness of 30 nm to 50 nm.

Preferably, the high resistivity film 70 has a surface resistance of $5\times10^8$ $\Omega/cm^2$ to $5\times10^9$ $\Omega/cm^2$.

In the illustrated embodiment, a light transmittance of the high resistance film 70 is greater than or equal to 92%. The light transmittance used herein refers to a ratio of a light transmittance of the in-cell touch screen 100 having the high resistivity film after forming the high resistivity film 70 and a light transmittance thereof before forming the high resistivity film 70.

In general, the less the surface resistance of the high resistivity film 70, the better the anti-static effect. However, the less the surface resistance is, the easier the In-Cell type touch screen is subjected to interference effect, such that the touch effect is influenced. The greater the resistance, the less obvious the anti-static effect. The conductivity of the ITO is very strong, when a higher resistance is required to achieve, the thickness of the film layer is too thin, which cannot play the role of anti-static.

The present disclosure has been experimentally shown that, when the high resistivity film 70 has a surface resistance of $5\times10^8$ $\Omega/cm^2$ to $5\times10^9$ $\Omega/cm^2$, the high resistivity film 70 has not only the anti-static effect but also no influence on the touch effect. In addition, the high resistivity film 70 has a proper thickness, a good light transmittance and electrical conductivity, as well as an excellent anti-static effect.

Figure 2:
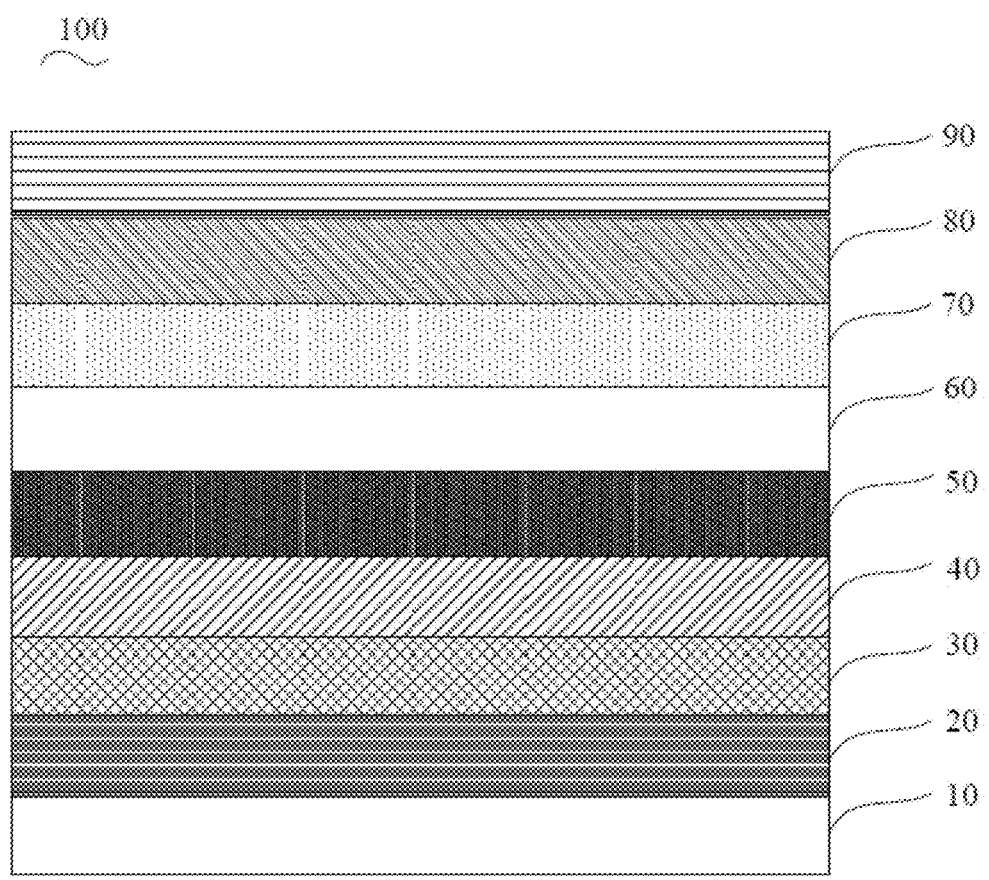
FIG. 2 is a schematic view of an in-cell touch screen having a high resistivity film according to another embodiment.

Referring to FIG. 2, an in-cell touch screen 100 having a high resistivity film according to another embodiment includes a first substrate 10, a thin film transistor substrate (TFT substrate) 20, a liquid crystal layer 30, a color filter 40, a touch sensing layer 50, and a second substrate 60, which are sequentially laminated. The in-cell touch screen 100 having the high resistivity film further includes a polarizing layer 80 and a protective cover plate 90.

The polarizing layer 80 is laminated on a surface of the high resistivity film 70 away from the second substrate 60, and the protective cover plate 90 is laminated on a surface of the polarizing layer 80 away from the high resistivity film 70.

Preferably, a material of a polarizer 90 is at least one selected from the group consisting of ethylene-vinyl acetate copolymer (EVA), polyethylene terephthalate (PET), polyvinyl alcohol (PVA), and aminopolyether polyol (AP).

Preferably, a material of the protective cover plate 90 is at least one selected from the group consisting of soda-lime glass, high alumina white glass, and xuhong high alumina glass.

Specifically, the touch panel can be divided into small pieces after forming the high resistivity film 70. The small piece generally has a size of about 4.5 inches to about 6 inches, which is suitable for the size of the mobile phone screen. After the small piece is cleaned, the polarizing layer 80 is formed on the high resistivity film 70, and then the protective cover plate 90 is laminated on the polarizing layer 80. Preferably, the protective cover plate 90 is bonded to the polarizing layer 80 via an optical adhesive, and the protective cover plate 90 can protect the high resistivity film 70.

A display device includes the aforementioned in-cell touch screen having the high resistivity film. Such display device has the advantages such as clear image, sensitive touch, and so on.

The aforementioned in-cell touch screen 100 having the high resistivity film includes the first substrate 10, the thin film transistor substrate 20, the liquid crystal layer 30, the color filter 40, the touch sensing layer 50, and the second substrate 60, which are sequentially laminated. The thin film transistor substrate 20 is provided with the plurality of mutually insulated sensing wires on the surface thereof facing the liquid crystal layer 30. The thin film transistor substrate 20 is engaged with the touch sensing layer 50, such that the touch panel function is embedded in the liquid crystal pixels, thereby reducing the thickness of the touch screen. The high resistivity film 70 is disposed on the surface of the second substrate 60 away from the touch sensing layer, and the high resistivity film 70 is electrically coupled to the thin film transistor substrate 20. Thus, the electrostatic generated by the thin film transistor substrate 20 can be discharged instantaneously by the high resistivity film 70, which plays a role of static elimination and reduces a mutual interference between the touch sensors, thereby improving the touch sensitivity of the in-cell touch screen. Meanwhile, the in-cell touch screen 100 having the high resistance film has a thinner thickness, an excellent light transmittance, and a simple manufacturing method.

The following will be described in detail with reference to specific examples.

In the following examples, the experimental method, which does not specify the specific conditions, unless otherwise specified, is generally in accordance with conventional conditions.

Instrument: automatic spraying equipment, drying furnace, cleaning machine, high resistance instrument, film thickness gauge, spectrometer, and so on.

Reagent: the surfactant is a DOW FAX 2A1 type surfactant produced by Dow Corporation of the United States; the crosslinking agent is SaC-100 type aziridine crosslinking agent produced by Shanghai Youen Chemical Co., Ltd.

Example 1

An in-cell touch screen having a high resistivity film was manufactured by the following steps:

(1) A thin film transistor substrate (TFT substrate) was laminated on a surface of a glass substrate (a first substrate), and a sensing wire layer was formed on a surface of the thin film transistor substrate. The sensing wire layer was made of ITO. The sensing wire was formed on the surface of the thin film transistor substrate after operations of exposure, development, etching, and the like, and a liquid crystal layer was formed on the thin film transistor substrate. A color filter was laminated to obtain an A plate.

(2) A touch sensing layer was formed on a surface of another glass substrate (a second substrate), and the touch sensing layer was made of ITO, thereby obtaining a B plate.

(3) The A plate and the B plate were bonded in a vacuum environment. The color filter and the touch sensing layer were bonded to each other, so as to obtain the first substrate, the thin film transistor substrate, the liquid crystal layer, the color filter, the touch sensing layer, and the second substrate, which were sequentially laminated.

(4) The high resistivity film was formed on a surface of the second substrate away from the touch sensing layer by the automatic spraying equipment. The substrate was fed onto a working table of the spraying equipment and was automatically positioned, and then a slurry was sprayed on the second substrate. The slurry included a mixture of graphite oxide, tin oxide, a surfactant, a crosslinking agent, and a solvent. Specifically, the slurry included, by weight parts, 5.5 parts of graphite oxide, 11.5 parts of tin oxide, 27.5 parts of surfactant, 18 parts of crosslinking agent, and 37.5 parts of water. A viscosity of the slurry was 35 cP. A distance of a spraying gun from the surface of the second substrate was 30 cm. A spraying pressure was 1.0 MPa, a working environment was dust-free space (100 class), a temperature was 25° C., and a humidity was 55%. After the spraying had completed, the substrate was baked in the drying furnace at a temperature of 115° C. for 15 minutes, and then was cooled to obtain the high resistivity film.

A thickness of the high resistivity film was measured by the film thickness gauge, which was 40 nm.

A transmittance of the high resistivity film was measured by the spectrometer, which was 97.8%.

A hardness of the film was 6H.

Of course, the touch screen also includes the manufacturing of a cover plate, a polarizer, and a lead, a conventional method may be employed, and is not limited thereto.

A resistance of the high resistivity film was measured by a resistance instrument, which was $5.5 \times 10^8$ $\Omega/cm^2$, which indicated that the high resistivity film had good electrical properties. A change rate of the resistance of the high resistivity film was 10% when a baking experiment was carried out at 90° C. and 60% humidity for 240 hours in a temperature humidity chamber, which indicated that the high resistivity film had good moisture resistance. The change rate of the resistance of the high resistivity layer was 10% after 5 minutes of alcohol immersion. The change rate of the resistance was 5% when baked at 60° C. in an oven with pad for 240 hours, which indicated that the high resistivity film had good heat resistance.

A sheet resistance of ITO of the touch sensing layer was 155Ω, and a thickness of the film was 250±50 Å.

The aforementioned in-cell touch screen having the high resistivity film has a strong stability and is not easily oxidized, and has an excellent electrical conductivity and a good light transmittance, as well as has excellent anti-static effect.

Example 2

An in-cell touch screen having a high resistivity film was manufactured by the following steps:

(1) A thin film transistor substrate (TFT substrate) was laminated on a surface of a glass substrate (a first substrate), and a sensing wire layer was formed on a surface of the thin film transistor substrate. The sensing wire layer was made of ITO. The sensing wire was formed on the surface of the thin film transistor substrate after operations of exposure, development, etching, and the like, and a liquid crystal layer was formed on the thin film transistor substrate. A color filter was laminated to obtain an A plate.

(2) A touch sensing layer was formed on a surface of another glass substrate (a second substrate), and the touch sensing layer was made of ITO, thereby obtaining a B plate.

(3) The A plate and the B plate were bonded in a vacuum environment. The color filter and the touch sensing layer were bonded to each other, so as to obtain the first substrate, the thin film transistor substrate, the liquid crystal layer, the color filter, the touch sensing layer, and the second substrate, which were sequentially laminated.

(4) The high resistivity film was formed on a surface of the second substrate away from the touch sensing layer by the automatic spraying equipment. The substrate was fed onto a working table of the spraying equipment and was automatically positioned, and then a slurry was sprayed on the second substrate. The slurry included a mixture of graphite oxide, tin oxide, a surfactant, a crosslinking agent, and a solvent. Specifically, the slurry included, by weight parts, 4 parts of graphite oxide, 10 parts of tin oxide, 25 parts of surfactant, 10 parts of crosslinking agent, and 30 parts of water. A viscosity of the slurry was 30 cP. A distance of a spraying gun from the surface of the second substrate was 20 cm. A spraying pressure was 0.5 MPa, a working environment was dust-free space (100 class), a temperature was 20° C., and a humidity was 50%. After the spraying had completed, the substrate was baked in the drying furnace at a temperature of 110° C. for 10 minutes, and then was cooled to obtain the high resistivity film.

A thickness of the high resistivity film was measured by the film thickness gauge, which was 30 nm.

A transmittance of the high resistivity film was measured by the spectrometer, which was 98%.

A hardness of the film was 6H.

Of course, the touch screen also includes the manufacturing of a cover plate, a polarizer, and a lead, a conventional method may be employed, and is not limited thereto.

A resistance of the high resistivity film was measured by a resistance instrument, which was $5 \times 10^8$ $\Omega/cm^2$, which indicated that the high resistivity film had good electrical properties. A change rate of the resistance of the high resistivity film was 10% when a baking experiment was carried out at 90° C. and 60% humidity for 240 hours in a temperature humidity chamber, which indicated that the high resistivity film had good moisture resistance. The change rate of the resistance of the high resistivity layer was 20% after 5 minutes of alcohol immersion. The change rate of the resistance was 5% when baked at 60° C. in an oven with pad for 240 hours, which indicated that the high resistivity film had good heat resistance.

A sheet resistance of ITO of the touch sensing layer was 60Ω, and a thickness of the film was 250±50 Å.

The aforementioned in-cell touch screen having the high resistivity film has a strong stability and is not easily oxidized, and has an excellent electrical conductivity and a good light transmittance, as well as has excellent anti-static effect.

Example 3

An in-cell touch screen having a high resistivity film was manufactured by the following steps:

(1) A thin film transistor substrate (TFT substrate) was laminated on a surface of a glass substrate (a first substrate), and a sensing wire layer was formed on a surface of the thin film transistor substrate. The sensing wire layer was made of ITO. The sensing wire was formed on the surface of the thin film transistor substrate after operations of exposure, development, etching, and the like, and a liquid crystal layer was formed on the thin film transistor substrate. A color filter was laminated to obtain an A plate.

(2) A touch sensing layer was formed on a surface of another glass substrate (a second substrate), and the touch sensing layer was made of ITO, thereby obtaining a B plate.

(3) The A plate and the B plate were bonded in a vacuum environment. The color filter and the touch sensing layer were bonded to each other, so as to obtain the first substrate, the thin film transistor substrate, the liquid crystal layer, the color filter, the touch sensing layer, and the second substrate, which were sequentially laminated.

(4) The high resistivity film was formed on a surface of the second substrate away from the touch sensing layer by the automatic spraying equipment. The substrate was fed onto a working table of the spraying equipment and was automatically positioned, and then a slurry was sprayed on the second substrate. The slurry included a mixture of graphite oxide, tin oxide, a surfactant, a crosslinking agent, and a solvent. Specifically, the slurry included, by weight parts, 7 parts of graphite oxide, 13 parts of tin oxide, 30 parts of surfactant, 26 parts of crosslinking agent, and 40 parts of water. A viscosity of the slurry was 40 cP. A distance of a spraying gun from the surface of the second substrate was 40 cm. A spraying pressure was 1.0 MPa, a working environment was dust-free space (100 class), a temperature was 30° C., and a humidity was 60%. After the spraying had completed, the substrate was baked in the drying furnace at a temperature of 120° C. for 20 minutes, and then was cooled to obtain the high resistivity film.

A thickness of the high resistivity film was measured by the film thickness gauge, which was 50 nm.

A transmittance of the high resistivity film was measured by the spectrometer, which was 96%.

A hardness of the film was 6H.

Of course, the touch screen also includes the manufacturing of a cover plate, a polarizer, and a lead, a conventional method may be employed, and is not limited thereto.

A resistance of the high resistivity film was measured by a resistance instrument, which was $5 \times 10^9$ $\Omega/cm^2$, which indicated that the high resistivity film had good electrical properties. A change rate of the resistance of the high resistivity film was 5% when a baking experiment was carried out at 90° C. and 60% humidity for 240 hours in a temperature humidity chamber, which indicated that the high resistivity film had good moisture resistance. The change rate of the resistance of the high resistivity layer was 10% after 5 minutes of alcohol immersion. The change rate of the resistance was 5% when baked at 60° C. in an oven with pad for 240 hours, which indicated that the high resistivity film had good heat resistance.

A sheet resistance of ITO of the touch sensing layer was 150Ω, and a thickness of the film was 250±50 Å.

The aforementioned in-cell touch screen having the high resistivity film has a strong stability and is not easily oxidized, and has an excellent electrical conductivity and a good light transmittance, as well as has excellent anti-static effect.

Example 4

An in-cell touch screen having a high resistivity film was manufactured by the following steps:

(1) A thin film transistor substrate (TFT substrate) was laminated on a surface of a glass substrate (a first substrate), and a sensing wire layer was formed on a surface of the thin film transistor substrate. The sensing wire layer was made of ITO. The sensing wire was formed on the surface of the thin film transistor substrate after operations of exposure, development, etching, and the like, and a liquid crystal layer was formed on the thin film transistor substrate. A color filter was laminated to obtain an A plate.

(2) A touch sensing layer was formed on a surface of another glass substrate (a second substrate), and the touch sensing layer was made of ITO, thereby obtaining a B plate.

(3) The A plate and the B plate were bonded in a vacuum environment. The color filter and the touch sensing layer were bonded to each other, so as to obtain the first substrate, the thin film transistor substrate, the liquid crystal layer, the color filter, the touch sensing layer, and the second substrate, which were sequentially laminated.

(4) The high resistivity film was formed on a surface of the second substrate away from the touch sensing layer by the automatic spraying equipment. The substrate was fed onto a working table of the spraying equipment and was automatically positioned, and then a slurry was sprayed on the second substrate. The slurry included a mixture of graphite oxide, tin oxide, a surfactant, a crosslinking agent, and a solvent. Specifically, the slurry included, by weight parts, 5 parts of graphite oxide, 12 parts of tin oxide, 28 parts of surfactant, 15 parts of crosslinking agent, and 36 parts of water. A viscosity of the slurry was 38 cP. A distance of a spraying gun from the surface of the second substrate was 40 cm. A spraying pressure was 1.0 MPa, a working environment was dust-free space (100 class), a temperature was 25° C., and a humidity was 55%. After the spraying had completed, the substrate was baked in the drying furnace at a temperature of 110° C. for 10 minutes, and then was cooled to obtain the high resistivity film.

A thickness of the high resistivity film was measured by the film thickness gauge, which was 50 nm.

A transmittance of the high resistivity film was measured by the spectrometer, which was 97%.

A hardness of the film was 6H.

Of course, the touch screen also includes the manufacturing of a cover plate, a polarizer, and a lead, a conventional method may be employed, and is not limited thereto.

A resistance of the high resistivity film was measured by a resistance instrument, which was $5 \times 10^9$ $\Omega/cm^2$, which indicated that the high resistivity film had good electrical properties. A change rate of the resistance of the high resistivity film was 5% when a baking experiment was carried out at 90° C. and 60% humidity for 240 hours in a temperature humidity chamber, which indicated that the high resistivity film had good moisture resistance. The change rate of the resistance of the high resistivity layer was 10% after 5 minutes of alcohol immersion. The change rate of the resistance was 10% when baked at 60° C. in an oven with pad for 240 hours, which indicated that the high resistivity film had good heat resistance.

A sheet resistance of ITO of the touch sensing layer was 150Ω, and a thickness of the film was 250±50 Å.

The aforementioned in-cell touch screen having the high resistivity film has a strong stability and is not easily oxidized, and has an excellent electrical conductivity and a good light transmittance, as well as has excellent anti-static effect.

The foregoing implementations are merely specific embodiments of the present disclosure, but are not intended to limit the protection scope of the present disclosure. It should be noted that any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. An in-cell touch screen having a high resistivity film, comprising: a first substrate, a thin film transistor substrate, a liquid crystal layer, a color filter, a touch sensing layer, a second substrate, and a high resistivity film, which are sequentially laminated; wherein the thin film transistor substrate is provided with a plurality of mutually insulated sensing wires on a surface thereof facing the liquid crystal layer, the high resistivity film is formed on a surface of the second substrate away from the touch sensing layer, the high resistivity film is electrically coupled to the thin film transistor substrate, wherein the high resistivity film is made of a mixture comprising graphite oxide, tin oxide, a surfactant, and a crosslinking agent; and wherein the high resistivity film comprises, by weight parts, 4 to 7 parts of graphite oxide, 10 to 13 parts of tin oxide, 25 to 30 parts of surfactant, and 10 to 26 parts of crosslinking agent.

2. The in-cell touch screen having a high resistivity film according to claim 1, wherein the crosslinking agent is an aziridine crosslinking agent.

3. The in-cell touch screen having a high resistivity film according to claim 1, wherein the high resistivity film has a thickness of 30 nm to 50 nm.

4. The in-cell touch screen having a high resistivity film according to claim 1, wherein the in-cell touch screen having a high resistivity film has a thickness of 0.6 mm to 0.8 mm.

5. The in-cell touch screen having a high resistivity film according to claim 1, wherein the sensing wire is made of indium tin oxide (ITO).

6. The in-cell touch screen having a high resistivity film according to claim 1, further comprising a polarizing layer laminated on a surface of the high resistivity film away from the second substrate.

7. The in-cell touch screen having a high resistivity film according to claim 6, further comprising a protective cover plate laminated on a surface of the polarizing layer away from the high resistivity film.

8. A display device, comprising an in-cell touch screen having a high resistivity film, wherein the in-cell touch screen having the high resistivity film comprises a first substrate, a thin film transistor substrate, a liquid crystal layer, a color filter, a touch sensing layer, a second substrate, and a high resistivity film, which are sequentially laminated; the thin film transistor substrate is provided with a plurality of mutually insulated sensing wires on a surface thereof facing the liquid crystal layer, the high resistivity film is formed on a surface of the second substrate away from the touch sensing layer, the high resistivity film is electrically coupled to the thin film transistor substrate, wherein the high resistivity film is made of a mixture comprising graphite oxide, tin oxide, a surfactant, and a crosslinking agent; and wherein the high resistivity film comprises, by weight parts, 4 to 7 parts of graphite oxide, 10 to 13 parts of tin oxide, 25 to 30 parts of surfactant, and 10 to 26 parts of crosslinking agent.

* * * * *